(12) United States Patent
Fontenot et al.

(10) Patent No.: US 11,199,449 B1
(45) Date of Patent: Dec. 14, 2021

(54) AUTOMATED NONCONTACT METHOD TO DISCRIMINATE WHETHER COOLING OR HEATING IS OCCURRING

(71) Applicant: The United States of America, as represented by the Secretary of the Navy, Washington, DC (US)

(72) Inventors: Ross S. Fontenot, Montgomery Village, MD (US); John H. Barkyoumb, Kensington, MD (US); Veerendra K. Mathur, Beltsville, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/578,136

(22) Filed: Sep. 20, 2019

Related U.S. Application Data

(63) Continuation-in-part of application No. 16/141,910, filed on Sep. 25, 2018, now Pat. No. 11,079,314.

(Continued)

(51) Int. Cl.
*G01J 3/44* (2006.01)
*G01N 21/63* (2006.01)
*G01N 21/64* (2006.01)

(52) U.S. Cl.
CPC .......... *G01J 3/4406* (2013.01); *G01N 21/636* (2013.01); *G01N 21/64* (2013.01)

(58) Field of Classification Search
CPC ...... G02B 7/028; G01N 21/171; G01N 25/00; G01N 25/02; G01N 25/16; G01N 25/18; G01N 25/20; G01K 17/00
See application file for complete search history.

(56) References Cited

U.S. PATENT DOCUMENTS

| | | | | |
|---|---|---|---|---|
| 4,213,699 A | * | 7/1980 | Moore | G01N 21/171 250/573 |
| 4,243,327 A | * | 1/1981 | Frosch | G01N 21/171 356/432 |

(Continued)

OTHER PUBLICATIONS

"Temperature Dependence of the Intensities of Raman Lines", K. Venkateswarlu, Nature vol. 159, pp. 96-97(1947) (Year: 1947).*

(Continued)

*Primary Examiner* — Mohamed K Amara
(74) *Attorney, Agent, or Firm* — Howard Kaiser

(57) ABSTRACT

According to exemplary practice of the present invention, a probe laser beam characterized by a Stokes luminescence wavelength is trained upon a thermally insulated medium; the Stokes luminescence is measured upon conclusion of the probe laser impingement of the medium. Following this first Stokes luminescence measurement, a pump laser beam characterized by an anti-Stokes luminescence wavelength is trained upon the medium; the Stokes luminescence is measured upon conclusion of the pump laser impingement of the medium. Each laser has a blocking device associated therewith. A computer is implemented to transmit control signals to open and close the two blocking devices in alternating fashion so that only one laser beam at a time is aimed at the medium. The computer is also implemented to process the measurement signals to determine heating versus cooling. If the luminescence intensity following the pump laser impingement exceeds the luminescence intensity following the probe laser impingement, then the medium is being cooled.

6 Claims, 9 Drawing Sheets

US 11,199,449 B1

Page 2

Related U.S. Application Data

(60) Provisional application No. 62/734,886, filed on Sep. 21, 2018, provisional application No. 62/563,501, filed on Sep. 26, 2017.

(56) References Cited

U.S. PATENT DOCUMENTS

| | | | | |
|---|---|---|---|---|
| 4,540,285 | A * | 9/1985 | Amer | G01N 21/171 356/432 |
| 4,708,494 | A * | 11/1987 | Kleinerman | G01D 5/268 250/361 R |
| 5,386,427 | A * | 1/1995 | Zayhowski | G02B 7/028 372/101 |
| 5,586,824 | A * | 12/1996 | Barkyoumb | G01N 25/18 374/44 |
| 5,696,863 | A * | 12/1997 | Kleinerman | G01K 11/32 385/123 |
| 5,986,793 | A * | 11/1999 | Yamaguchi | G02B 7/028 359/204.1 |
| 6,087,181 | A * | 7/2000 | Cong | B01J 19/0046 356/432 |
| 6,370,172 | B1 | 4/2002 | Bowman | |
| 7,277,178 | B2 * | 10/2007 | Shpantzer | G01N 21/171 356/451 |
| 9,594,026 | B2 * | 3/2017 | Joo | G01N 21/171 |
| 10,082,456 | B2 * | 9/2018 | Hashizume | G01N 21/171 |
| 10,371,630 | B2 * | 8/2019 | Deguchi | G01N 21/5907 |
| 11,079,314 | B1 * | 8/2021 | Fontenot | G01K 17/00 |
| 2003/0002038 | A1 * | 1/2003 | Mawatari | G01N 21/171 356/300 |
| 2003/0176777 | A1 * | 9/2003 | Muller-Dethlefs | G01N 21/65 600/322 |
| 2004/0085540 | A1 * | 5/2004 | Lapotko | G01N 21/171 356/432 |
| 2004/0233450 | A1 * | 11/2004 | Yamaguchi | G01N 21/171 356/432 |
| 2006/0181708 | A1 * | 8/2006 | Takahashi | G01N 21/45 356/432 |
| 2006/0214113 | A1 * | 9/2006 | Kleinerman | G01J 5/046 250/458.1 |
| 2007/0263426 | A1 * | 11/2007 | Hiraga | G02F 3/02 365/154 |
| 2008/0124247 | A1 * | 5/2008 | Matsuoka | G01N 21/645 422/82.08 |
| 2009/0027654 | A1 * | 1/2009 | Takahashi | G01N 21/00 356/36 |
| 2009/0050201 | A1 * | 2/2009 | Fortmann | H01L 31/055 136/259 |
| 2012/0026485 | A1 * | 2/2012 | Couston | G01N 21/45 356/125 |
| 2012/0309636 | A1 * | 12/2012 | Gibbons | G01N 21/51 506/9 |
| 2012/0312028 | A1 * | 12/2012 | Kashyap | F25B 23/00 62/3.1 |
| 2013/0081690 | A1 * | 4/2013 | Fortmann | H01L 31/055 136/256 |
| 2015/0094219 | A1 * | 4/2015 | Trowell | B01L 3/502715 506/9 |
| 2015/0105284 | A1 * | 4/2015 | Willson | G01N 33/58 506/9 |
| 2015/0211998 | A1 * | 7/2015 | Kuo | G01N 21/64 356/301 |
| 2015/0247938 | A1 * | 9/2015 | Penumadu | G01T 3/06 250/362 |
| 2015/0292956 | A1 * | 10/2015 | Mitchell | G01K 11/32 356/73.1 |
| 2015/0308958 | A1 * | 10/2015 | Lemieux | G01N 21/6408 435/287.2 |
| 2015/0338268 | A1 * | 11/2015 | Ramer | G01J 1/18 250/208.1 |
| 2016/0109167 | A1 * | 4/2016 | Xiong | F25B 23/00 62/3.1 |
| 2016/0178506 | A1 * | 6/2016 | Hashizume | G01N 21/171 356/416 |
| 2016/0376247 | A1 * | 12/2016 | Kang | C07D 491/22 435/29 |
| 2018/0088041 | A1 * | 3/2018 | Zhang | G01J 5/22 |
| 2018/0246032 | A1 * | 8/2018 | Li | G01N 21/171 |
| 2018/0372554 | A1 * | 12/2018 | Laycock | G01N 21/645 |
| 2019/0120753 | A1 | 4/2019 | Prater et al. | |
| 2019/0162643 | A1 * | 5/2019 | Drinovec | G01N 21/636 |
| 2020/0025677 | A1 * | 1/2020 | Prater | G01N 21/6458 |
| 2020/0253017 | A1 * | 8/2020 | Khanh | H05B 47/105 |

OTHER PUBLICATIONS

U.S. Appl. No. 62/563,501, filed Sep. 26, 2017, entitled "Photothermal Deflection Spectroscopy Method for Heating-Cooling Discrimination," joint inventors Ross S. Fontenot, Veerendra K. Mathur, and John H. Barkyoumb, Navy Case No. 104,704.

Ross S. Fontenot, Veerendra K. Mathur, and John H. Barkyoumb, "New Photothermal Deflection Technique to Discriminate between Heating and Cooling," Journal of Quantitative Spectroscopy and Radiative Transfer, vol. 204, Elvesier Ltd., available online Aug. 30, 2017, pp. 1-6.

Ross S. Fontenot, "Laser Cooling of CdSeZnS Quantum Dots," 34-page slide presentation, presented on Mar. 15, 2017, University of Louisiana at Lafayette (ULL).

Ross S. Fontenot, "Laser Cooling of CdSeZnS Quantum Dots," 38-page slide presentation, presented on Oct. 4, 2016, PRiME 2016 Conference of the Electrochemical Society, Honolulu, Hawaii, Oct. 2-7, 2016.

Ross S. Fontenot, Veerendra K. Mathur, John H. Barkyoumb, Carl E. Mungan, and Thanh N. Tran, "Measuring the Anti-Stokes Luminescence of CdSe/ZnS Quantum Dots for Laser Cooling Applications," Proceedings of SPIE 9821, Tri-Technology Device Refrigeration (TTDR), 982103 (May 17, 2016).

Ross S. Fontenot, John H. Barkyoumb, and Veerendra K. Mathur, "Optical Cooling of CdSe/ZnS Quantum Dots Embedded in PMMA," Oct. 4, 2017 poster session, 232nd ECS Meeting, National Harbor, MD, Oct. 1-5, 2017 (Abstract MA2017-02 2235).

Ross Fontenot, Veerendra Mathur, John Barkyoumb, Carl Mungan, and Thanh Tran, "Laser Cooling of CdSe/ZnS Quantum Dots," Oct. 4, 2016 poster session, PRIME 2016 (Pacific Rim Meeting), Oct. 2-7, 2016, Honolulu, Hawaii (Abstract J01-3131).

Stephen Potashnik, John Barkyoumb, Ross Fontenot, Danielle Braje, and Linh Pham, "Anti-stokes Luminescence of the NV-center in Diamond from a 785 nm Pump Beam," May 29, 2019 poster session, 50th Annual Meeting of the American Physical Society (APS), Division of Atomic, Molecular and Optical Physics (DAMOP), vol. 64, No. 4, May 27-31, 2019, Milwaukee, Wisconsin (ABSTRACT 101.00138; date submitted Feb. 1, 2019).

Stephen Potashnik, John Barkyoumb, Ross Fontenot, Danielle Braje, and Linh Pham, "Anti-stokes Luminescence of the NV-center in Diamond from a 785 nm Pump Beam," May 29, 2019 poster session, 50th Annual Meeting of the American Physical Society (APS), Division of Atomic, Molecular and Optical Physics (DAMOP), vol. 64, No. 4, May 27-31, 2019, Milwaukee, Wisconsin (Poster I01.00138).

U.S. Appl. No. 62/734,886, filed Sep. 21, 2018, entitled "Automated Noncontact Method to Discriminate if Cooling is Occurring," inventors Ross S. Fontenot et al., Navy Case No. 108,765.

U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

U.S. Appl. No. 62/697,866, filed Jul. 13, 2018, entitled Navy Case No. 105,643, Fontenot et al., "Luminescence-Based Method for Precise Delivery of Ion Beam Therapy," inventors Ross S. Fontenot et al., Navy Case No. 105,643.

U.S. Appl. No. 16/503,095, filed Jul. 3, 2019, entitled "Luminescence-Based Method for Precise Delivery of Ion Beam Therapy," inventors Ross S. Fontenot et al., Navy Case No. 105,643.

Notice of References Cited (part of Jul. 6, 2020 non-final Office action), U.S. Appl. No. 16/141,910, filed Sep. 25, 2018, entitled

(56) References Cited

OTHER PUBLICATIONS

"Photothermal Deflection Spectroscopy Method for Heating-Cooling Discrimination," inventors Ross S. Fontenot et al., Navy Case No. 104,704.

Notice of References Cited (part of Feb. 4, 2021 final Office action), U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

Information Disclosure Statement by Applicant form (6 pages; submitted on Dec. 6, 2020; considered by the examiner on Jan. 29, 2021), U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

Office Action Summary (part of dated Feb. 4, 2021 final Office action), U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

Office Action Summary (part of dated Jul. 6, 2020 non-final Office action), U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

First page of 19-page amendment submitted on Dec. 6, 2020 in response to dated Jul. 6, 2020 non-final Office action, U.S. Appl. No. 16/141,910, filed Sep. 25, 2018, entitled "Photothermal Deflection Spectroscopy Method for Heating-Cooling Discrimination," inventors Ross S. Fontenot et al., Navy Case No. 104,704.

Ross S. Fontenot, John H. Barkyoumb, and Veerendra K. Mathur, "Optical Cooling of CdSe/ZnS Quantum Dots Embedded in PMMA," 232nd ECS Meeting, National Harbor, MD, Oct. 4, 2017, ECS Transactions, vol. 80, Issue 10, pp. 1483-1488 (2017).

* cited by examiner

| Viewing Window (s) | Area Change in PL (%) | Number That Cooled | Intensity Change in PL (%) | Number That Cooled |
| --- | --- | --- | --- | --- |
| 1 | 1.4181 ± 1.2962 | 6/7 | 1.6688 ± 2.3434 | 5/7 |
| 2 | 1.3603 ± 1.3525 | 6/7 | 0.6540 ± 1.4877 | 5/7 |
| 3 | 1.4871 ± 1.2532 | 6/7 | 0.8202 ± 1.0840 | 5/7 |
| 4 | 1.4304 ± 1.3124 | 6/7 | 1.0520 ± 1.0615 | 6/7 |
| 5 | 1.3505 ± 1.2465 | 6/7 | 0.9396 ± 0.9664 | 6/7 |
| 6 | 1.2797 ± 1.2213 | 6/7 | 0.7855 ± 1.3405 | 6/7 |
| 7 | 1.2686 ± 1.2096 | 5/7 | 0.9941 ± 1.1749 | 6/7 |
| 8 | 1.2289 ± 1.1961 | 6/7 | 1.0254 ± 1.1727 | 6/7 |
| 9 | 1.2468 ± 1.1868 | 6/7 | 1.0080 ± 1.1618 | 6/7 |

FIG. 4

| | |
|---|---|
| EXPERIMENT | • SpectraSuite saved a spectra data file every 1 second for the laser emission.<br>• PMT recorded the CdSe emission every second.<br>• Time stamp was recorded for each. |
| PYTHON ANALYSIS | • Python was used to determine the total light emission of the laser using the trapz function.<br>• The results of each spectra file was recorded in a data frame.<br>• These results were then merged with the PMT files by the time stamp.<br>• Normalized yield was determined by dividing the PMT counts by the total laser emission for each.<br>• Thus, we had seven data frames, i.e., one data frame for each run. |
| COOLING ANALYSIS | • The window size (or average) was varied between 1 and 10.<br>• To determine if cooling occurred, the normalized ratio of the window after cooling laser was turned off was compared to that just before the cooling laser was turned on.<br>• Amount of cooling was determined by $(PL_{after} - PL_{before})/PL_{before}$.<br>• A positive number represents cooling. |
| THREE-SECOND WINDOW EXAMPLE | 1) The first three normalized cooling ratios were averaged and the error was estimated using propagation of errors for Run 1.<br>2) The last three normalized RT ratios were averaged and the error was estimated using propagation of errors for Run 1.<br>3) The ratios before and after cooling were compared.<br>4) The amount of cooling was also determined.<br>5) These results were saved to a data frame.<br>6) The process was repeated for Runs 2-7.<br>7) Now, we had seven cooling percentages and seven cooling results (True or False).<br>8) The average cooling percentage was calculated for the seven runs.<br>9) The standard deviation of these seven runs were also calculated. |

FIG. 9

AUTOMATED NONCONTACT METHOD TO DISCRIMINATE WHETHER COOLING OR HEATING IS OCCURRING

CROSS-REFERENCE TO RELATED APPLICATIONS

This application claims the benefit of U.S. provisional application No. 62/734,886, filing date 21 Sep. 2018, hereby incorporated herein by reference, entitled "Automated Noncontact Method to Discriminate Whether Cooling Is Occurring," joint inventors Ross S. Fontenot, John H. Barkyoumb, and Veerendra K. Mathur.

This application is a continuation-in-part of U.S. nonprovisional patent application Ser. No. 16/141,910, filing date 25 Sep. 2018, hereby incorporated herein by reference, entitled "Photothermal Deflection Spectroscopy Method for Heating-Cooling Discrimination," joint inventors Ross S. Fontenot, Veerendra K. Mathur, and John H. Barkyoumb, which claims the benefit of U.S. provisional patent application No. 62/563,501, filing date 26 Sep. 2017, hereby incorporated herein by reference, entitled "Photothermal Deflection Spectroscopy Method for Heating-Cooling Discrimination," joint inventors Ross S. Fontenot, Veerendra K. Mathur, and John H. Barkyoumb.

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to cooling of materials, more particularly to laser cooling of solids and to determination of whether cooling of the solids is occurring.

Stokes emission and anti-Stokes emission are important concepts in studying optical and other properties of materials. Anti-Stokes emission results in photons of shorter wavelength (higher photon energy) than that of the exciting light, due to thermal absorption. Laser cooling of solids (also referred to in the literature as "optical refrigeration") is a noncontact methodology that uses anti-Stokes luminescence to cool materials, e.g., to cryogenic temperatures. In order for this laser cooling methodology to work, the sample being investigated must be extremely pure and the quantum efficiency of the sample must be near unity. It is because of these requirements that a noncontact way of determining whether cooling is occurring is necessitated. Adding other elements (such as thermocouples) to an experiment typically adds excess heat to the system, which overwhelms the cooling taking place.

The following references, each of which is hereby incorporated herein by reference, are pertinent to laser cooling: Ross S. Fontenot, R. S., Veerendra K. Mathur, John H. Barkyoumb, Carl E. Mungan, and Thanh N. Tran, "Measuring the Anti-Stokes Luminescence of CdSe/ZnS Quantum Dots for Laser Cooling Applications," *Proceedings of SPIE* 9821, Tri-Technology Device Refrigeration (TTDR), 982103 (17 May 2016); J. H. Barkyoumb and D. J. Land, "Thermal Diffusivity Measurement of Thin Wires Using Photothermal Detection," *J. Appl. Phys.* 78, 905 (1995); Method of Measuring the Thermal Conductivity of Microscopic Graphite Fibers, J. H. Barkyoumb, L. T. Kabacoff, and D. J. Land, U.S. Pat. No. 5,586,824, issued December 1996); Epstein, R. and Sheik-Bahae, M., [Optical Refrigeration: Science and Applications of Laser Cooling of Solids], Wiley-VCH, Weinheim, Germany, Chapter 1 Optical Refrigeration in Solids: Fundamentals and Overview, 1-32 (2009); Nemova, G. and Kashyap, R., "Laser Cooling of Solids," *Reports on the Progress of Physics*, 73, 086501 (2010); Sheik-Bahae, M. and Epstein, R. I., "Optical Refrigeration," *Nature Photonics*, 1, 693-699 (2007); Edwards, B. C., Buchwald, M. I., and Epstein, R. I., "Development of the Los Alamos Solid-State Optical Refrigerator," *Review of Scientific Instruments*, 69(5), 2050-2055 (1998); Zhang, J., Li, D., Chen, R., and Xiong, Q., "Laser Cooling of a Semiconductor by 40 Kelvin," *Nature*, 43, 504-508 (2013); Jackson, W. B., Amer, N. M., Boccara, A. C., and Fournier, D., "Photothermal Deflection Spectroscopy and Detection," *Applied Optics*, 20(8), 1333-44 (1981); Loriette, V., and Boccara, C., "Absorption of Low-Loss Optical Materials Measured at 1064 nm by a Position-Modulated Collinear Photothermal Detection Technique," *Applied Optics*, 42(4), 649-656 (2003); Mungan C. E., Buchwald M. I., Edwards B. C., Epstein, R. I. and Gosnell T. R., "Internal Laser Cooling of $Yb^{3+}$-Doped Glass Measured between 100 and 300 K," *Appl. Phys. Lett.* 71(11), 1458-1460 (1997); S. R. Bowman, U.S. Pat. No. 6,370,172, "Non-Exothermic Quasi-Two Level Laser," issued 9 Apr. 2002; M. Kern, J. Jeske, D. W. M. Lau, A. D. Greentree, F. Jelezko, and J. Twamley, "Optical Cryocooling of Diamond," *Phys. Rev. B* 95, 235306 (21 Jun. 2017); Stephen Potashnik, John Barkyoumb, Ross Fontenot, Danielle Braje, and Linh Pham, Abstract L01.00138 and poster presentation, "Anti-Stokes Luminescence of the NV-Center in Diamond from a 785 Pump Beam," $50^{th}$ Annual Meeting of the APS Division of Atomic, Molecular and Optical Physics APS Meeting, Volume 64, Number 4, 27-31 May 2019, Milwaukee, Wis.

SUMMARY OF THE INVENTION

In view of the foregoing, an object of the present invention is to provide an efficacious methodology for determining whether cooling of the solids is actually occurring during a process involving laser cooling of solids. In furtherance of this object, the present inventors incorporate elements from their previous work as disclosed by the aforesaid Fontenot et al., "New Photothermal Deflection Technique to Discriminate between Heating and Cooling," and the aforesaid U.S. nonprovisional patent application Ser. No. 16/141,910.

The present invention, as exemplarily embodied, provides a method for determining whether or not cooling of a material (e.g., CdSe/ZnS quantum dots) is occurring. The inventive method bases this determination on whether or not there is a change (increase or decrease) in intensity of Stokes luminescence (also referred to herein as "conventional luminescence") in a sample, as a result of sequential laser excitations of the sample by a Stokes luminescence laser followed by an anti-Stokes luminescence laser. Otherwise expressed, a period of Stokes luminescence excitation is alternated with a period of anti-Stokes luminescence excitation.

Exemplary inventive practice includes an alternation between a first laser excitation period and a second laser excitation period. In the first period of laser excitation, the Stokes excitation laser ("probe laser") is exciting the sample, while the anti-Stokes excitation laser is not. In the second period of laser excitation, the anti-Stokes excitation laser ("pump laser") is exciting the sample, while the Stokes excitation laser is not. Stokes luminescence intensity measurements are taken on two occasions, viz., a first set of measurements is taken immediately before the anti-Stokes laser excitation period commences, and a second set of measurements is taken immediately after the anti-Stokes laser excitation period ends.

An important basis for exemplary inventive practice is the distinction between two kinds of photoluminescence ("PL"), viz., Stokes photoluminescence and anti-Stokes photoluminescence. If the Stokes luminescence in the sample increases in intensity between the first set of measurements (taken immediately before the anti-Stokes laser excitation period commences) and the second set of measurements (taken immediately after the anti-Stokes laser excitation period ends), then cooling of the sample is occurring. On the other hand, if the Stokes luminescence in the sample does not increase (e.g., decreases) in intensity between the first set of measurements and the second set of measurements, then cooling of the sample is not occurring (e.g., heating of the sample is occurring).

An exemplary inventive method includes the observation of the conventional luminescence in a thermally isolated sample excited by a 520 nm green diode laser. The 520 nm measurement is alternated with excitation of any potential cooling from the 785 nm anti-Stokes excitation. A thermally isolated sample is excited by a Stokes excitation laser (e.g., a 520 nm green diode laser), and the Stokes luminescence (conventional luminescence) is observed. The sample is then excited by an anti-Stokes excitation laser (e.g., a 785 nm green diode laser), and the Stokes luminescence (conventional luminescence) is again observed. The 785 nm anti-Stokes laser excitation is the cause of any potential cooling in the sample, which is determined based on a comparison between the 520 nm green diode laser measurements and the 785 nm green diode laser measurements.

According to an exemplary embodiment of the present invention's method for determining whether cooling is occurring, the known inverse relationship between photoluminescence intensity and temperature is used as a surrogate to temperature change. The NV-diamond sample is mounted in a thermally isolated vacuum chamber. The Stokes luminescence is measured with a wide-20 nm window about 700 nm. This becomes the baseline. The sample is alternately heated (or cooled) with a uv laser (404 nm) and the Anti-stokes wavelength of 785 nm. The PL is measured for a few seconds immediately after irradiation; simple thermal transport is used to determine time. All of the lasers, shutters, and measurements are computer-controlled via MATLAB and Python scripts to minimize variation.

BRIEF DESCRIPTION OF THE DRAWINGS

The present invention will now be described, by way of example, with reference to the accompanying drawings, wherein:

FIG. 4 is a table illustrating changes in photoluminescence for viewing windows of various durations (seconds), in accordance with an example of inventive practice.

FIG. 9 is a table illustrating an example of determining cooling from Spectra files, in accordance with the present invention.

Figure 1:
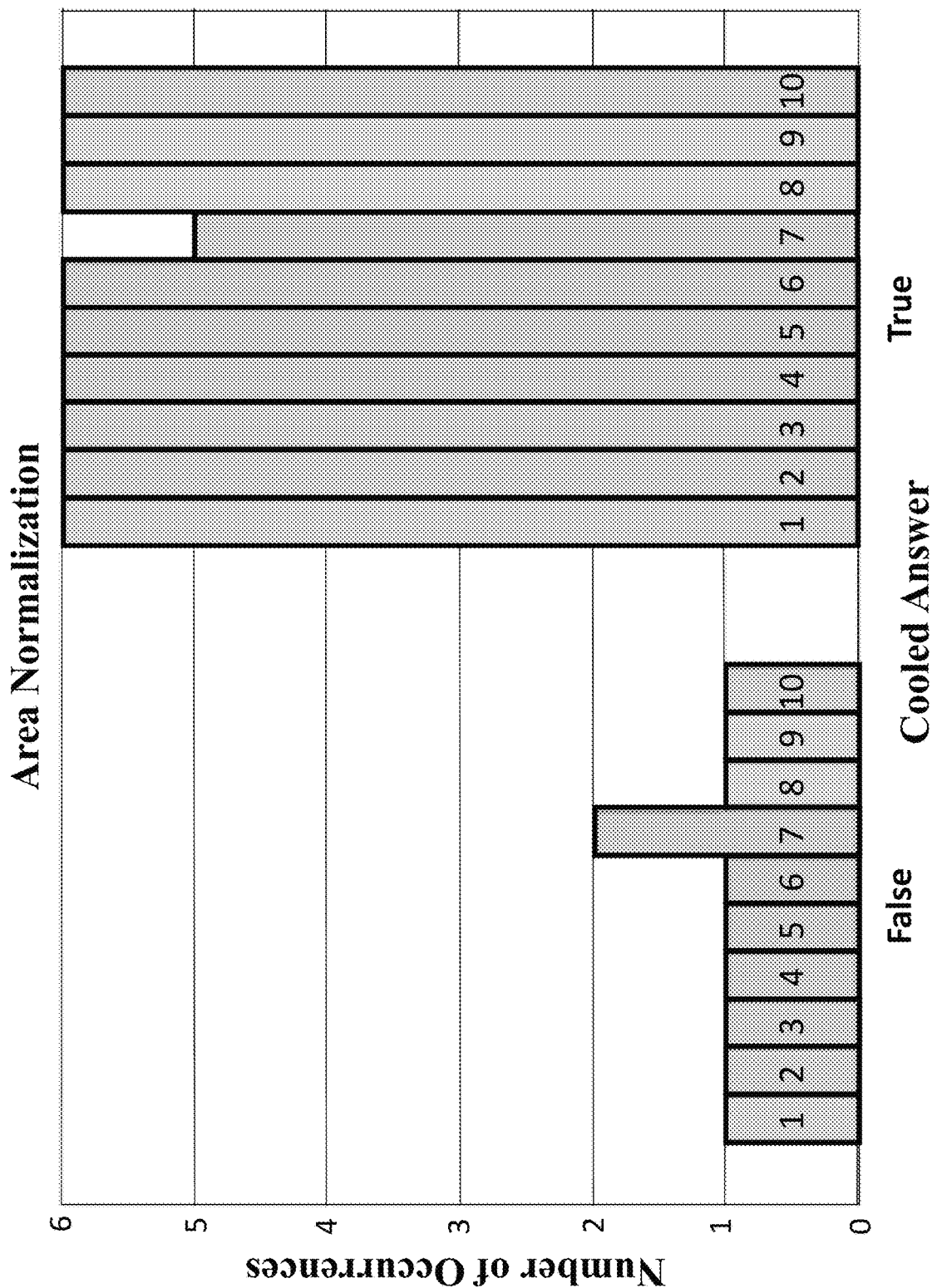
FIG. 1 is a graph illustrating numbers of occurrences of cooling and heating that occurred based on area normalization, in accordance with an example of inventive practice.

DESCRIPTION OF PREFERRED
EMBODIMENTS OF THE INVENTION

In 2017 the present inventors developed a manual method to determine if a sample is cooling. This earlier invention by the present inventors is disclosed in the following two references, each of which is hereby incorporated herein by reference: Ross S. Fontenot, Veerendra K. Mathur, and John H. Barkyoumb, "New Photothermal Deflection Technique to Discriminate between Heating and Cooling," Journal of Quantitative Spectroscopy and Radiative Transfer, Volume 204, Elvesier Ltd., available online 30 Aug. 2017, pages 1-6; and the aforesaid U.S. nonprovisional patent application Ser. No. 16/141,910, filing date 25 Sep. 2018, entitled "Photothermal Deflection Spectroscopy Method for Heating-Cooling Discrimination," joint inventors Ross S. Fontenot, Veerendra K. Mathur, and John H. Barkyoumb. The experimentation began by placing a polymerized CdSe/ZnS sample inside of a sample chamber. Then the sample was placed under vacuum with pressure of around 5 µTorr. Changes in luminescent intensity were used to determine if laser cooling was occurring.

As disclosed by Fontenot et al. "New Photothermal Deflection Technique to Discriminate between Heating and Cooling," the present inventors used a Thorlabs 404 nm laser diode set to a low power to measure the photoluminescence (sometimes abbreviated in the literature as "PL") before cooling. A large waveguide was used to couple to the CdSe photons into an Oriel single monochromator set to 660 nm and fully open slits. This allowed 16 nm of light to pass through the monochromator and reach a photomultiplier tube ("PMT"). That is, by setting the monochromator to 660 nm, the present inventor would count the 652 to 668 nm photons. An Ocean Optics Jaz spectrometer was used to monitor the 404 nm laser power. An OBIS 660 nm laser set to 50 mW was used to cool the CdSe/ZnS polymer. The lasers were first blocked using laser blocks, and the sample chamber was evacuated. After the lasers and the sample reached equilibrium, the PL laser (404 nm diode) was unblocked and the photoluminescence was recorded for ten minutes to obtain the room temperature (RT) photoluminescence.

The present inventors found that it usually took one hour for the lasers and sample to reach equilibrium, and that this equilibrium was determined by a stable laser diode temperature. After the 10 minutes of recordation expired, a laser block was placed in front of the PL laser, and the block was removed from the OBIS cooling laser. Once thirty minutes of cooling occurred, the block was placed in front of the cooling laser and removed from the PL laser such that the cooling photoluminescence could be determined. Blocks were placed in front of all of the lasers; after the 10 minutes of cooling, photoluminescence was determined. The sample was then brought back to atmosphere for one hour such that it could reach equilibrium. Afterwards, the experiment was repeated.

Reference is now made to FIGS. 1 through 4. Subsequent to their research as disclosed in the aforementioned paper entitled "New Photothermal Deflection Technique to Discriminate between Heating and Cooling," the present inventors conducted further experimentation in laser cooling. The present inventors disclosed some of their more recent research in the following paper, hereby incorporated herein by reference, which was made a part of the aforesaid U.S. provisional application No. 62/734,886: Ross S. Fontenot, John H. Barkyoumb, and Veerendra K. Mathur, "Optical Cooling of CdSe/ZnS Quantum Dots Embedded in PMMA," 232nd ECS Meeting, National Harbor, Md., 4 Oct. 2017, *ECS Transactions*, Volume 80, Issue 10, pages 1483-1488 (2017). The present inventors gave a presentation on 4 Oct. 2017 at the 232nd ECS Meeting, and later published their paper in ECS Transactions.

Figure 2:
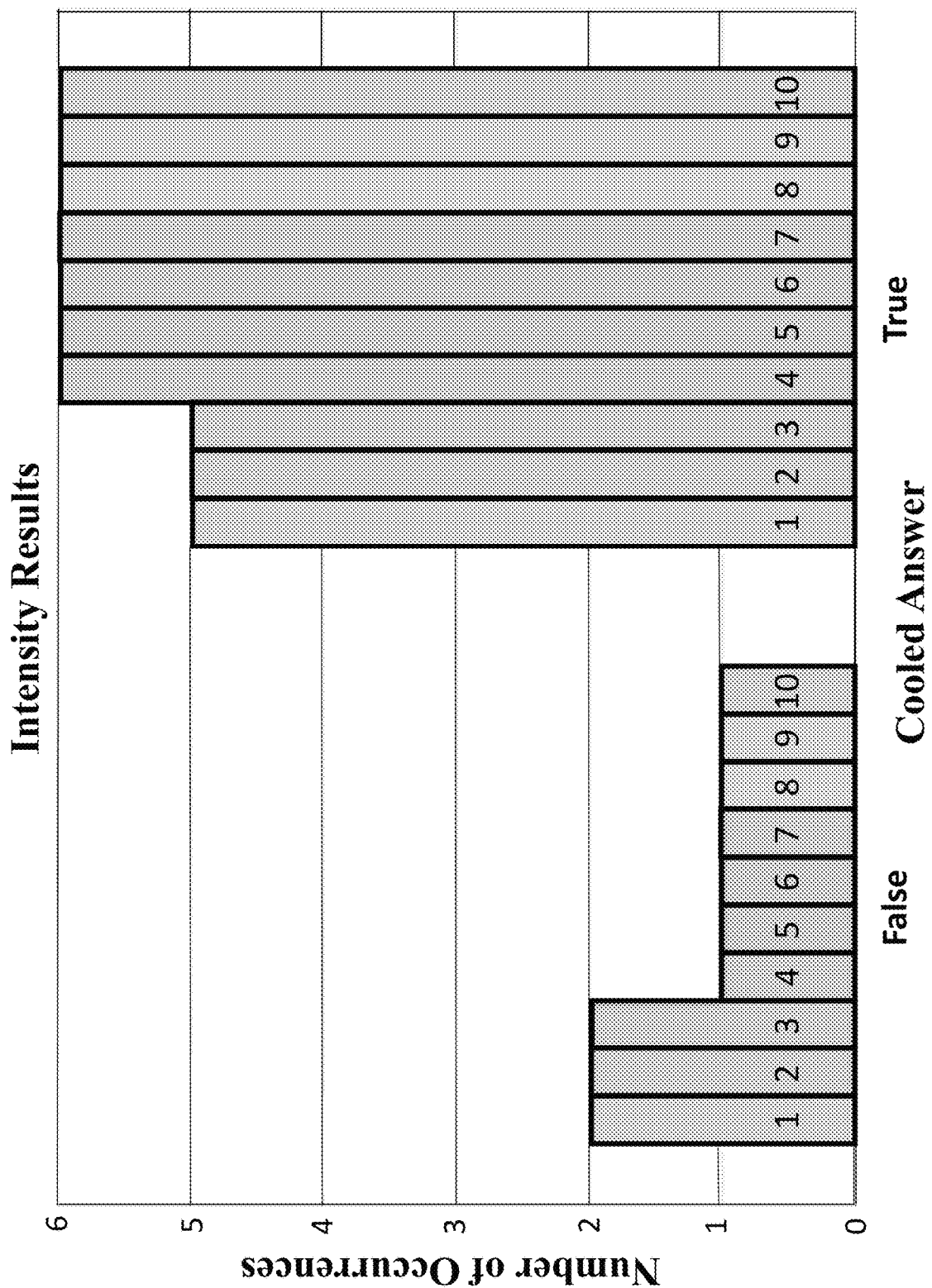
FIG. 2 is a graph, similar to FIG. 1, illustrating numbers of occurrences of cooling and heating that occurred based on intensity results, in accordance with an example of inventive practice.
Figure 3:
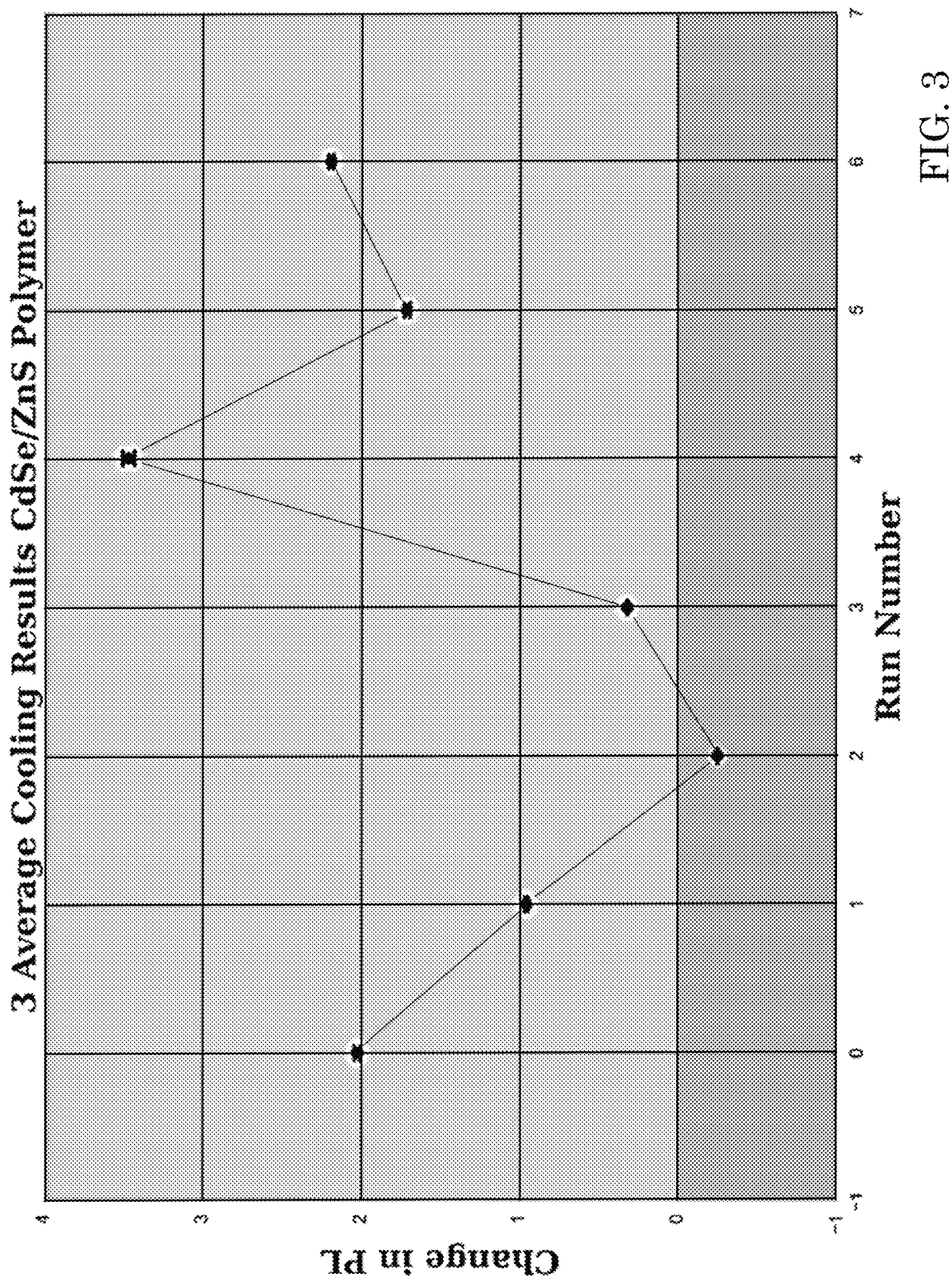
FIG. 3 is a graph illustrating changes in photoluminescence versus run number, in accordance with an example of inventive practice.

As disclosed in their paper entitled "Optical Cooling of CdSe/ZnS Quantum Dots Embedded in PMMA," an exemplary embodiment of the present invention determines cooling from change (increase) of Stokes luminescence intensity in CdSe/ZnS Quantum Dots. To confirm that either cooling or heating occurred the present inventors looked at the last room temperature (RT) spectra just before the OBIS laser was turned on, and looked at the first "cooled" spectra just after the OBIS laser was blocked. The amount of spectra analyzed varied from 1 to 10 to obtain a viewing window of 1 to 10 seconds. FIGS. 1 and 2 show the results for the ten viewing windows. FIG. 1 shows results indicating the number of times laser cooling of the sample occurred using the area under the curve. FIG. 2 shows results indicating the number of times laser cooling of the sample occurred using the intensity. The individual cooling percentages for the three-second window are shown in FIG. 3. That is, FIG. 3 shows the % change of photoluminescence from CdSe/ZnS quantum dots subjected to the inventive cooling experiments. The data points above the zero line indicated increase in photoluminescence, and the data points below the zero line indicated decrease in photoluminescence.

Generally, Stokes photoluminescence intensity increases with a decrease in temperature. As depicted in FIGS. 1 and 2, a "True" result means that the photoluminescence was greater after the cooling laser was turned off, as compared to the last room temperature measurements; this indicated that cooling of the sample occurred. Likewise, a "False" result means that the photoluminescence after the cooling laser was turned off was lower than the last room temperature measurements; this indicated that cooling (decrease in temperature) of the sample did not occur, or equivalently, that heating (increase in temperature) of the sample occurred. That is, a "True" answer occurs when the normalized cooled spectra in that window is greater than the room temperature spectra. Similarly, a "False" answer occurs when the normalized cooled spectra in that window is less than the room temperature spectra.

FIG. 4 is a table showing the change in photoluminescence for various window sizes (averages). The results illustrate the change in photoluminescence for each run using the area under the curve normalization. The average change in photoluminescence is shown for the seven runs. As shown in FIG. 4, changing the viewing windows does not significantly change the cooling results. There could be a slight decrease in photoluminescence with increasing window length, which is to be expected as the sample comes back to equilibrium and absorbs heat from the excitation laser. The change in photoluminescence would be much quicker if the tests were performed at atmosphere pressures in which the sample could interact with the environment. Moreover, it is evident that the intensity yields a more varied result when compared to the area under the curve.

Jing et al. disclose that the photoluminescence of CdS/ZnS changes 1.3% for every 1° C. change in temperature. Pengtao Jing, Jinju Zheng, Micho Ikezawa, Xueyan Liu, Shaozhe Lv, Xianggui Kong, Jialong Zhao, and Yasuaki Masumoto, "Temperature-Dependent Photoluminescence of CdSe-Core CdS/CdZnS/ZnS-Multishell Quantum Dots," Journal of Physical Chemistry C, Volume 113, pages 13545-13550 (10 Jul. 2009), hereby incorporated herein by reference. Using these results from Jing et al., the present inventors estimate the cooling in their afore-described experimentation to be approximately 1° C., as noted by the present inventors in their paper entitled "Optical Cooling of CdSe/ZnS Quantum Dots Embedded in PMMA."

Figure 5:
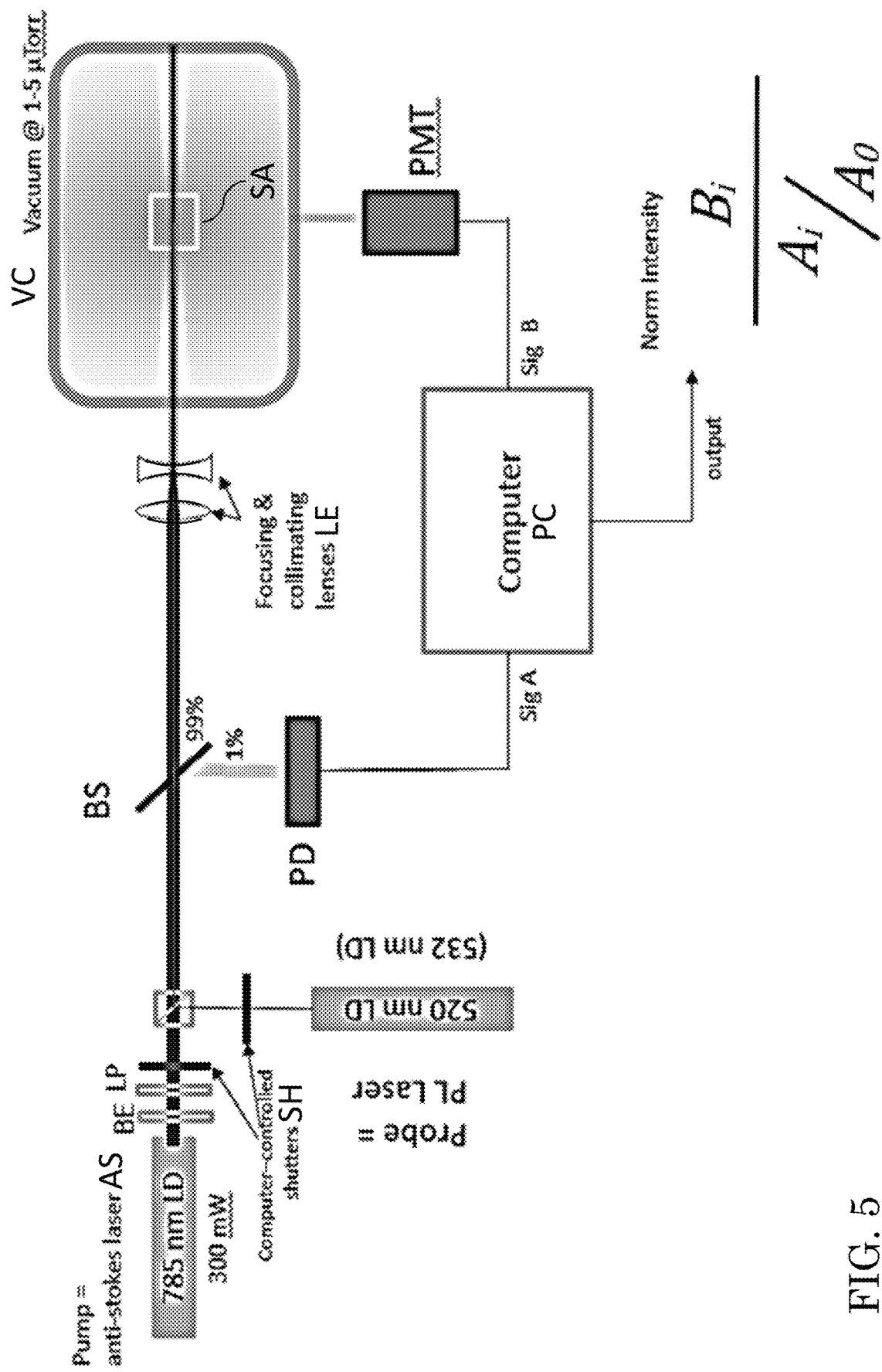
FIG. 5 is a schematic of an exemplary automatic cooling apparatus in accordance with the present invention, as experimentally implemented by the present inventors.
Figure 6:
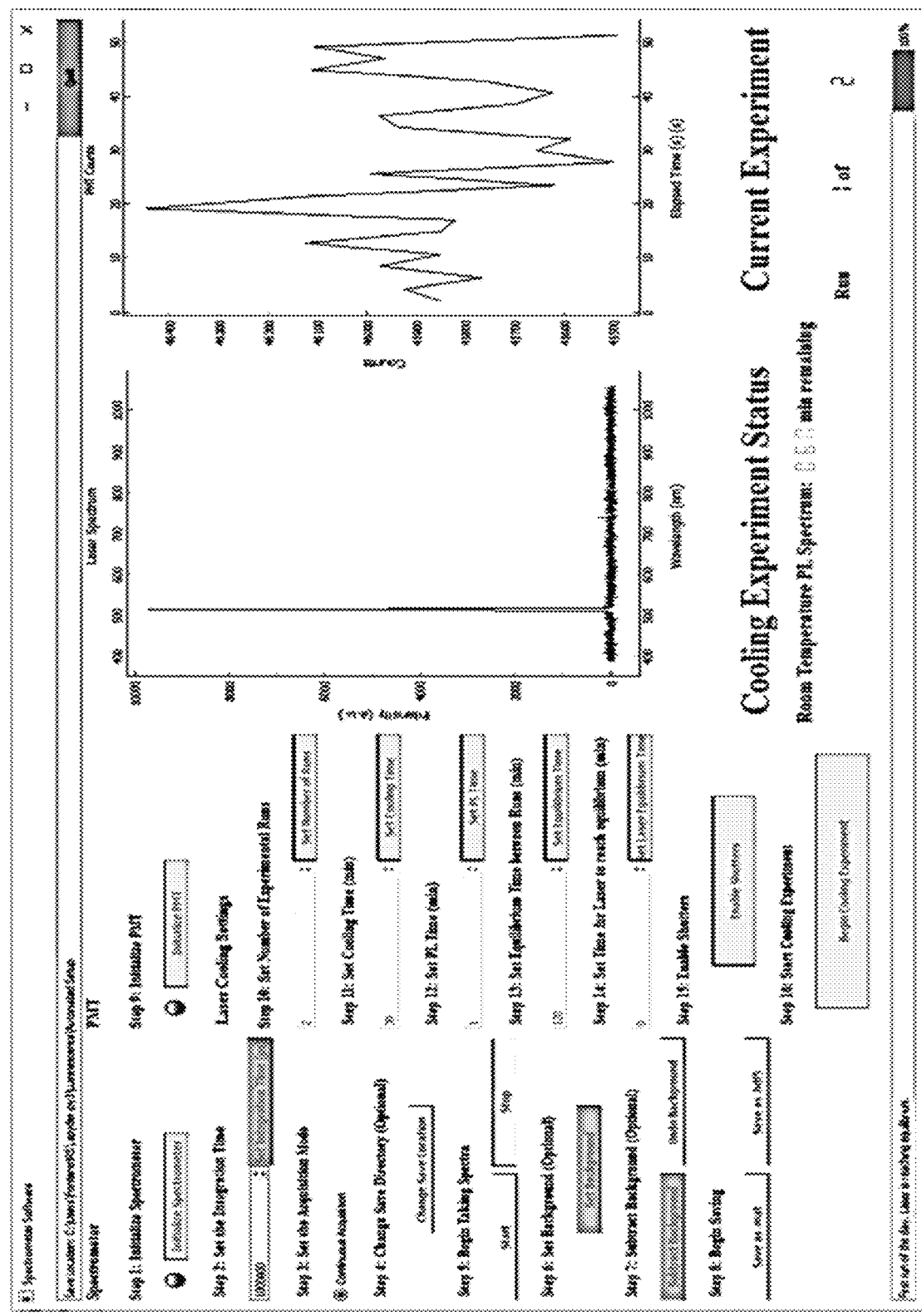
FIG. 6 is a screenshot of the Python GUI (Graphical User Interface) software that was used to control the inventive experiment depicted in FIG. 5.
Figure 7:
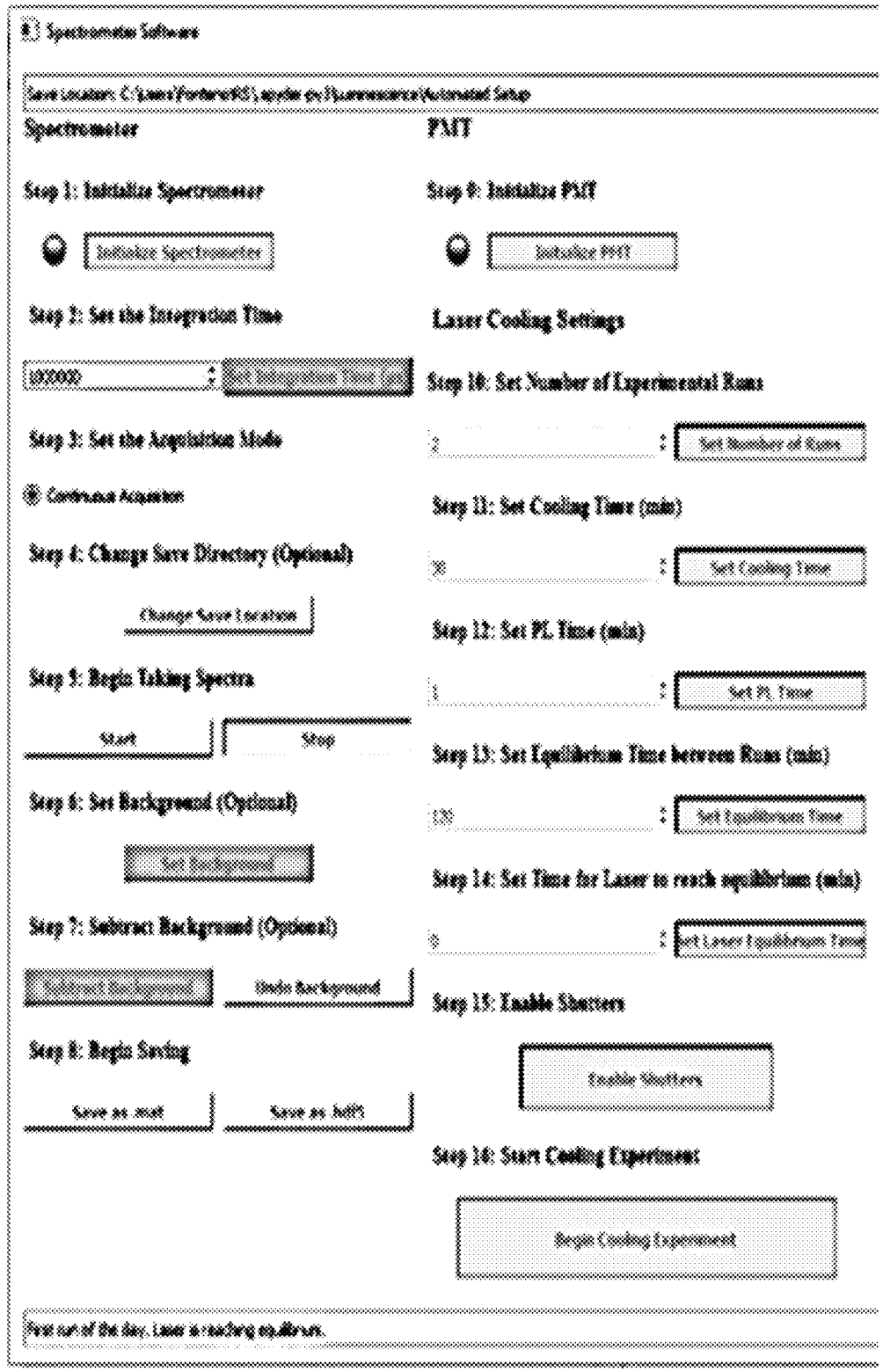
FIGS. 7 and 8 are partial and enlarged views of approximately the left half and approximately the right half, respectively, of the screenshot shown in FIG. 6.
Figure 8:
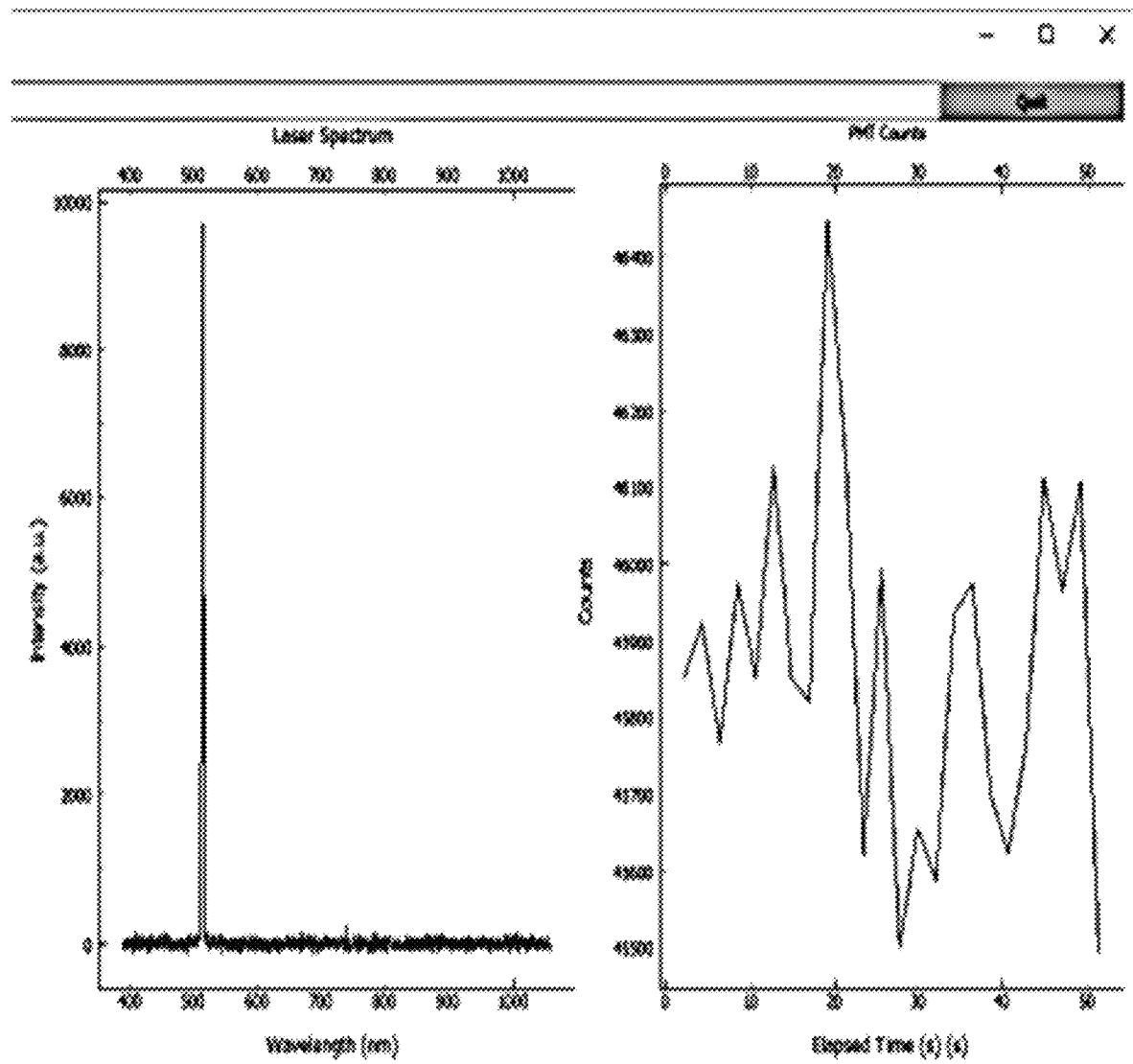

Based on their previous research, the present inventors decided that an "automatic" method was needed for more accurate results. Accordingly, the present inventors more recently conducted a new laser cooling experiment, significantly differing from their previous cooling experimentation. This "automated" inventive embodiment is illustrated by way of example in FIGS. 5 through 8. FIG. 5 is a schematic of the exemplary automatic cooling apparatus implemented in accordance with the present invention. FIG. 6 is a screenshot of the Python GUI that was used to control the inventive experiment illustrated in FIG. 5. FIGS. 7 and 8 are enlarged left-hand and right-hand portions, respectively, constituting the screenshot shown in FIG. 6. FIG. 9 is illustrative, by way of example, of inventive implementation of a computer to receive and process data. As shown in FIG. 9, the inventive process is the same for each window. The only thing that changes is the average; in addition, the one-second window's average would have no standard deviation. A photograph of the exemplary inventive automatic cooling apparatus is shown in the aforementioned U.S. provisional application No. 62/734,886, to which the instant application claims priority.

As distinguished from the above-described manual methods of the present inventors, the present invention as exemplarily embodied represents an automated noncontact method to determine whether a sample (material) is cooling or heating. Exemplary practice of the present invention features, inter alia, an implementation of computer software such as including a Python Graphical User Interface code specially written for controlling shutters that in turn block and unblock lasers. Furthermore, exemplary inventive practice exploits the fact that the conventional (Stokes) photoluminescence intensity increases with a decrease in temperature. In the light of the instant disclosure, the ordinarily skilled artisan will appreciate how to implement computer code in practicing the present invention, in order to control laser shutters for blocking and unblocking laser beams, and in order to compare photoluminescence before and after laser cooling to determine whether cooling or heating has occurred.

In terms of apparatus, the present invention's experimental setup such as illustrated in FIG. 5 bears some similarity to the experimental setups that the present inventors previously disclosed respectively in the aforesaid papers Fontenot et al., "New Photothermal Deflection Technique to Discriminate between Heating and Cooling" and Fontenot et al., "Optical Cooling of CdSe/ZnS Quantum Dots Embedded in PMMA." FIG. 5 shows an example of inventive apparatus used to determine cooling from change (increase) of Stokes luminescence intensity. A diamond sample SA is in thermal isolation in a vacuum chamber VC.

As shown in FIG. 5, the exemplary apparatus implemented in the presently inventive experimentation included a computer PC, a vacuum chamber VC, two computer-controlled shutters SH, two focusing and collimating lenses LE, an anti-Stokes excitation laser (also referred to herein as a "cooling laser" or "pump laser") AS, a Stokes excitation laser (also referred to herein as a "photoluminescence laser" or "probe laser") PL, a long-pass filter LP, a beam expander BE, a beam splitter BS, a photomultiplier tube PMT, and a photodiode PD. Depending on the inventive embodiment, a photodiode may be used instead of photomultiplier tube PMT. In this inventive example, a long-pass filter LP was necessary for the spectral characteristics of the laser that the present inventors used in this experiment; nevertheless, a long-pass filter LP may not be needed for some other laser sources that may be used in inventive practice.

According to the experimentation that the present inventors conducted in investigating their automated methodology, a sample SA was placed inside a sample chamber VC, and the air was evacuated to the microTorr range. For this experiment, the present inventors used a nitrogen vacancy diamond as the sample SA; nevertheless, depending on the inventive embodiment, practically any solid sample can be used in inventive practice. Probe laser PL included a Thorlabs 520 nm laser diode LD, which was used for measuring the photoluminescence. Pump (cooling) laser AS included a 785 nm Thorlabs laser diode LD, which was used to produce the anti-Stokes luminescence for cooling. An Oriel single monochromator with a Hamamatsu photomultiplier tube PMT was used to measure the photoluminescence from the sample. As distinguished from their previous experimentation, a pair of shutters SH, a beam expander BE, a long pass filter LP, and a beam splitter BS were used in conducting their experiment of their automated method. Two shutters SH were used instead of laser blocks so that the lasers AS and PL could each be blocked and unblocked automatically using scripts from the computer PC. A first computer-controlled shutter SH was associated with pump (cooling) laser AS; a second computer-controlled shutter SH was associated with probe (photoluminescence) laser PL.

A wave guide was used by the present inventors in some of their previous experimentation. In this experimentation, instead of a wave guide, the present inventors used a beam expander BE along with a pass filter LP for blocking the laser light. A further difference, vis-à-vis their previous experimentation, was their placement of a beam splitter BS between the PL laser and the sample SA; this allowed for the Jaz spectrometer to better monitor the PL laser intensity. The rest of the present inventors' experimental apparatus remained relatively the same as or similar to their previous experimental apparatuses as were respectively disclosed in the aforesaid papers Fontenot et al., "New Photothermal Deflection Technique to Discriminate between Heating and Cooling" and Fontenot et al., "Optical Cooling of CdSe/ZnS Quantum Dots Embedded in PMMA."

The inventive "automatic" experiment was commenced by turning on the vacuum pump, shutter controllers, Jaz spectrometer, cooling (anti-Stokes) laser diode controller, and photoluminescence laser diode controller. The cooling laser AS was set to about 200 mA and 25° C., while the photoluminescence laser PL was set to about 160 mA and 10° C. Using Spyder, a Python Integrated Development Environment (IDE), the present inventors ran the automatedSoftware.Py file in the computer. This brought up the automated GUI, an example of which is shown in FIGS. 6 through 8. The present inventors initialized the spectrometer and set the integration time, e.g., set to 800 ms. The laser was then blocked so that a background can be obtained. The user then has the option to set the location to save data or remain in the default direction, which will be where the Python script is located. Once the begin-taking-spectrum button is pressed, the user can set the background and then subtract the background so that the spectrometer is set to zero.

The spectrometer having been set, photomultiplier tube PMT was then initialized. This process automatically set the voltage to default and 800 ms integration time. The user then must set the number of experimental runs they want to complete as well as the cooling, photoluminescence, sample equilibrium, and laser equilibrium times. Shutters SH can then be initialized and will be closed by default so that both lasers AS and PL and the sample SA can reach equilibrium.

Once every component in the inventive cooling system that needs to be set is set, the user pushes the begin-cooling experiment button to begin the experiment and, for the time being, is free to leave the experiment and attend to other tasks. The computer program's for-loops (for iteration) will open and close the shutters when needed and record the necessary data. Between runs while the sample is reaching equilibrium, the script analyzes the data by comparing the photoluminescence before and after laser cooling to determine whether cooling or heating occurs. The amount of cooling or heating is then written to a text file with either cooling or heating written in the name. The user can check throughout the day to determine which runs cooled or heated by looking at the corresponding folders.

The present invention's methodology, as exemplarily embodied, represents a novel way, using luminescence, to automatically determine whether a sample can be heated or cooled. Moreover, some embodiments of inventive practice may be characterized by a mounting of equipment to an optical bench so as to provide a portable all-in-one system. There are a number of theoretical alternatives to determining the temperature of a sample. The present inventors have considered some approaches that rely on changes in luminescent intensity, decay time, or full width at half maximum (FWHM) of the spectrum. The present invention is unique in providing an automated heating or cooling check of a material, using features such as luminescent intensity, decay time, and/or FWHM of the spectrum.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications, and changes to the principles disclosed herein may be made by one skilled in the art without departing from the true scope and spirit of the present invention, which is indicated by the following claims.

What is claimed is:

1. A method for determining whether heating or cooling of a medium is occurring in association with impingement thereupon by laser energy, the method comprising:
   providing a Stokes excitation laser;
   providing an anti-Stokes excitation laser;
   causing a Stokes laser shutter to be open and an anti-Stokes laser shutter to be closed, wherein said anti-Stokes laser shutter blocks said anti-Stokes excitation laser when said anti-Stokes laser shutter is closed, and wherein said Stokes laser shutter does not block a Stokes excitation laser when said Stokes laser shutter is open;

causing a sample to absorb photons from said Stokes excitation laser, wherein said Stokes laser shutter is open and said anti-Stokes laser shutter is closed;

dividing a Stokes laser beam produced by said Stokes excitation laser into a first split-portion Stokes laser beam and a second split-portion Stokes laser beam, said first split-portion Stokes laser beam directed toward said sample, said second split-portion Stokes laser beam not directed toward said sample, wherein said photons that are absorbed from said Stokes excitation laser come from said first split-portion Stokes laser beam;

following said absorption of said photons from said Stokes excitation laser, performing a first luminescence measurement of said sample;

causing said anti-Stokes laser shutter to be open and said Stokes laser shutter to be closed, wherein said Stokes laser shutter blocks said Stokes excitation laser when said Stokes laser shutter is closed, and wherein said anti-Stokes laser shutter does not block said anti-Stokes excitation laser when said anti-Stokes laser shutter is open;

causing said sample to absorb photons from said anti-Stokes excitation laser, wherein said anti-Stokes laser shutter is open and said Stokes laser shutter is closed;

following said absorption of photons from said anti-Stokes excitation laser, performing a second luminescence measurement of said sample;

processing spectral data, said processing of said spectral data including performing area-under-the-curve integration with respect to some said spectral data, performing normalization with respect to some said spectral data, and determining whether heating of said sample or cooling of said sample is occurring as a result of said causing of said sample to absorb photons from said anti-Stokes excitation laser, wherein:

said spectral data is representative of a first total light emission and a second total light emission;

said first total light emission corresponds to said first luminescence measurement;

said second total light emission corresponds to said second luminescence measurement;

said normalization takes into account said second split-portion Stokes laser beam;

an increase in total light emission from said first total light emission to said second total light emission is indicative of cooling of said sample;

a decrease in total light emission from said first total light emission to said second total light emission is indicative of heating of said sample;

wherein a computer is implemented for automating said opening and said closing of said Stokes laser shutter, said opening and said closing of said anti-Stokes laser shutter, and said processing of said spectral data.

2. The method of claim 1, wherein said performing of said first luminescence measurement includes using a photomultiplier tube, and wherein said performing of said second luminescence measurement includes using a photomultiplier tube.

3. The method of claim 1, wherein said performing of said first luminescence measurement includes using a photodiode, and wherein said performing of said second luminescence measurement includes using a photodiode.

4. The method of claim 1, wherein said performing of said first luminescence measurement includes using at least one of a photomultiplier tube and a photodiode, and wherein said performing of said second luminescence measurement includes using at least one of a photomultiplier tube and a photodiode.

5. An apparatus for determining whether heating or cooling of a medium is occurring in association with impingement thereupon by laser energy, the apparatus comprising:

a Stokes excitation laser, for causing a sample to absorb photons from said Stokes excitation laser;

an anti-Stokes excitation laser, for causing said sample to absorb photons from said anti-Stokes excitation laser;

a beam splitter, for dividing a Stokes laser beam produced by said Stokes excitation laser into a first split-portion Stokes laser beam and a second split-portion Stokes laser beam, said first split-portion Stokes laser beam directed toward said sample, said second split-portion Stokes laser beam not directed toward said sample, wherein said photons that are absorbed from said Stokes excitation laser come from said first split-portion Stokes laser beam;

a Stokes laser shutter, wherein said Stokes laser shutter does not block said Stokes excitation laser when said Stokes laser shutter is open, said Stokes laser shutter blocks said Stokes excitation laser when said Stokes laser shutter is closed, said Stokes laser shutter is caused to be open during a period in which said sample absorbs photons from said Stokes excitation laser, and said Stokes laser shutter is caused to be closed during a period in which said sample absorbs photons from said anti-Stokes excitation laser;

an anti-Stokes laser shutter, wherein said anti-Stokes laser shutter does not block said anti-Stokes excitation laser when said anti-Stokes laser shutter is open, said anti-Stokes laser shutter blocks said anti-Stokes excitation laser when said anti-Stokes laser shutter is closed, said anti-Stokes laser shutter is caused to be open during a period in which said sample absorbs photons from said anti-Stokes excitation laser, and said anti-Stokes laser shutter is caused to be closed during a period in which said sample absorbs photons from said Stokes excitation laser;

a light sensory device, for performing a first luminescence measurement of said sample following said absorption of photons from said Stokes excitation laser, and for performing a second luminescence measurement of said sample following said absorption of photons from said anti-Stokes excitation laser, said light sensory device including a photomultiplier tube;

a computer having computer code characterized by computer program logic executable by said computer for enabling said computer to automatically perform acts including:

effecting said opening and said closing of said Stokes laser shutter;

effecting said opening and said closing of said anti-Stokes laser shutter;

processing spectral data, said processing of said spectral data including performing area-under-the-curve integration with respect to some said spectral data, performing normalization with respect to some said spectral data, and determining whether heating of said sample or cooling of said sample is occurring as a result of said causing of said sample to absorb photons from said anti-Stokes excitation laser, wherein:
  said spectral data is representative of a first total light emission and a second total light emission;
  said first total light emission corresponds to said first luminescence measurement;
  said second total light emission corresponds to said second luminescence measurement;
  said normalization takes into account said second split-portion Stokes laser beam;
  an increase in total light emission from said first total light emission to said second total light emission is indicative of cooling of said sample;
  a decrease in total light emission from said first total light emission to said second total light emission is indicative of heating of said sample.

6. An apparatus for determining whether heating or cooling of a medium is occurring in association with impingement thereupon by laser energy, the apparatus comprising:
  a Stokes excitation laser, for causing a sample to absorb photons from said Stokes excitation laser;
  an anti-Stokes excitation laser, for causing said sample to absorb photons from said anti-Stokes excitation laser;
  a beam splitter, for dividing a Stokes laser beam produced by said Stokes excitation laser into a first split-portion Stokes laser beam and a second split-portion Stokes laser beam, said first split-portion Stokes laser beam directed toward said sample, said second split-portion Stokes laser beam not directed toward said sample, wherein said photons that are absorbed from said Stokes excitation laser come from said first split-portion Stokes laser beam;
  a Stokes laser shutter, wherein said Stokes laser shutter does not block said Stokes excitation laser when said Stokes laser shutter is open, said Stokes laser shutter blocks said Stokes excitation laser when said Stokes laser shutter is closed, said Stokes laser shutter is caused to be open during a period in which said sample absorbs photons from said Stokes excitation laser, and said Stokes laser shutter is caused to be closed during a period in which said sample absorbs photons from said anti-Stokes excitation laser;
  an anti-Stokes laser shutter, wherein said anti-Stokes laser shutter does not block said anti-Stokes excitation laser when said anti-Stokes laser shutter is open, said anti-Stokes laser shutter blocks said anti-Stokes excitation laser when said anti-Stokes laser shutter is closed, said anti-Stokes laser shutter is caused to be open during a period in which said sample absorbs photons from said anti-Stokes excitation laser, and said anti-Stokes laser shutter is caused to be closed during a period in which said sample absorbs photons from said Stokes excitation laser;
  a light sensory device, for performing a first luminescence measurement of said sample following said absorption of photons from said Stokes excitation laser, and for performing a second luminescence measurement of said sample following said absorption of photons from said anti-Stokes excitation laser, said light sensory device including a photodiode;
  a computer having computer code characterized by computer program logic executable by said computer for enabling said computer to automatically perform acts including:
  effecting said opening and said closing of said Stokes laser shutter;
  effecting said opening and said closing of said anti-Stokes laser shutter;
  processing spectral data, said processing of said spectral data including performing area-under-the-curve integration with respect to some said spectral data, performing normalization with respect to some said spectral data, and determining whether heating of said sample or cooling of said sample is occurring as a result of said causing of said sample to absorb photons from said anti-Stokes excitation laser, wherein:
    said spectral data is representative of a first total light emission and a second total light emission;
    said first total light emission corresponds to said first luminescence measurement;
    said second total light emission corresponds to said second luminescence measurement;
    said normalization takes into account said second split-portion Stokes laser beam;
    an increase in total light emission from said first total light emission to said second total light emission is indicative of cooling of said sample;
    a decrease in total light emission from said first total light emission to said second total light emission is indicative of heating of said sample.

* * * * *